(12) United States Patent
Kamel et al.

(10) Patent No.: US 7,532,010 B2
(45) Date of Patent: May 12, 2009

(54) SENSING CIRCUIT AND METHOD FOR DIAGNOSING OPEN AND SHORT CIRCUIT CONDITIONS OF A SENSOR

(75) Inventors: Ashraf K. Kamel, Indianapolis, IN (US); Robert W Koseluk, Carmel, IN (US); Kevin M. Gertiser, Kokomo, IN (US); Larry R. Hach, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 132 days.

(21) Appl. No.: 11/527,742

(22) Filed: Sep. 25, 2006

(65) Prior Publication Data

US 2008/0074117 A1 Mar. 27, 2008

(51) Int. Cl.
  *G01R 31/00* (2006.01)
  *G01R 31/08* (2006.01)
(52) U.S. Cl. .................... 324/503; 324/522
(58) Field of Classification Search ............. 324/503, 324/522
  See application file for complete search history.

(56) References Cited

U.S. PATENT DOCUMENTS

| | | | | |
|---|---|---|---|---|
| 4,599,982 A | * | 7/1986 | Sugiura | 123/406.37 |
| 6,988,483 B1 | * | 1/2006 | Hagari | 123/406.16 |
| 7,010,419 B2 | * | 3/2006 | Abe et al. | 701/111 |
| 2004/0103714 A1 | * | 6/2004 | Fukuoka et al. | 73/35.04 |
| 2006/0250142 A1 | * | 11/2006 | Abe | 324/663 |

* cited by examiner

*Primary Examiner*—Vincent Q Nguyen
*Assistant Examiner*—Amy He
(74) *Attorney, Agent, or Firm*—Jimmy L. Funke

(57) ABSTRACT

A sensing circuit for detecting open and short circuit conditions in sensors is provided. The sensing circuit includes switching circuitry, a voltage supply, a test capacitor, and an operational amplifier. The switching circuitry is electrically coupled to the voltage supply, test capacitor, operational amplifier, and a sensor. The sensing circuit is configured to provide for a normal operating mode in which the sensing circuit provides an output indicative of a voltage across the sensor, and a charging mode in which the test capacitor is coupled to the sensor and operational amplifier and charged to a steady state, and in which the output of the operational amplifier is a function of the test capacitor capacitance and the capacitance of the sensor. A method for detecting open and short circuit conditions in sensors is also provided.

16 Claims, 5 Drawing Sheets

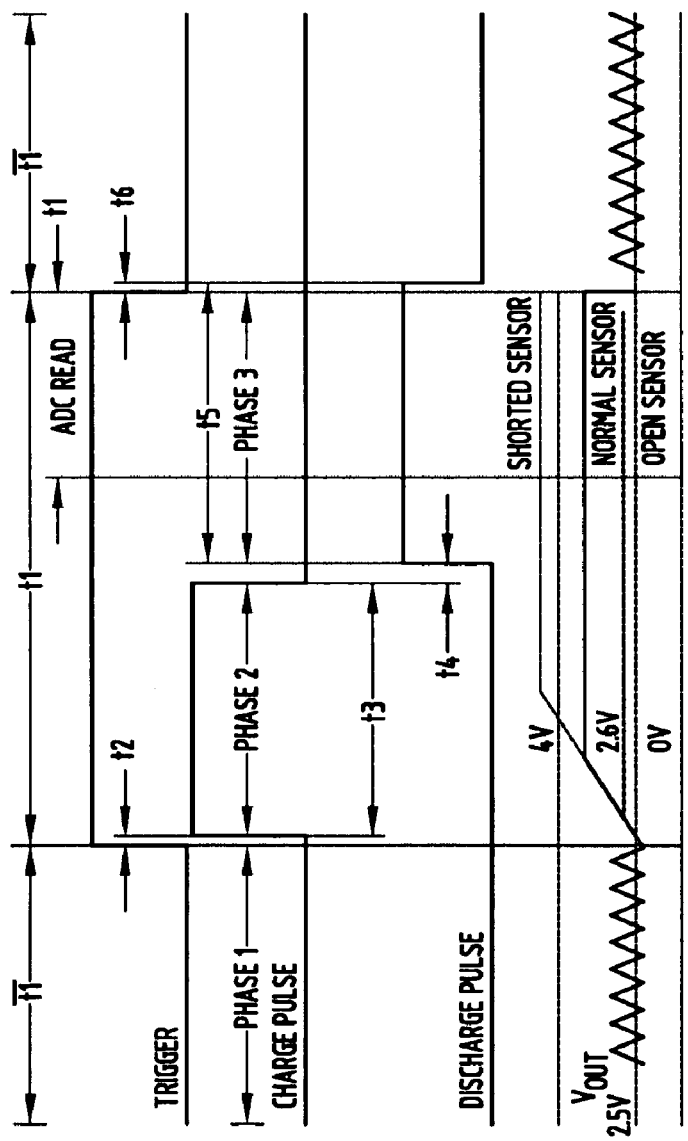

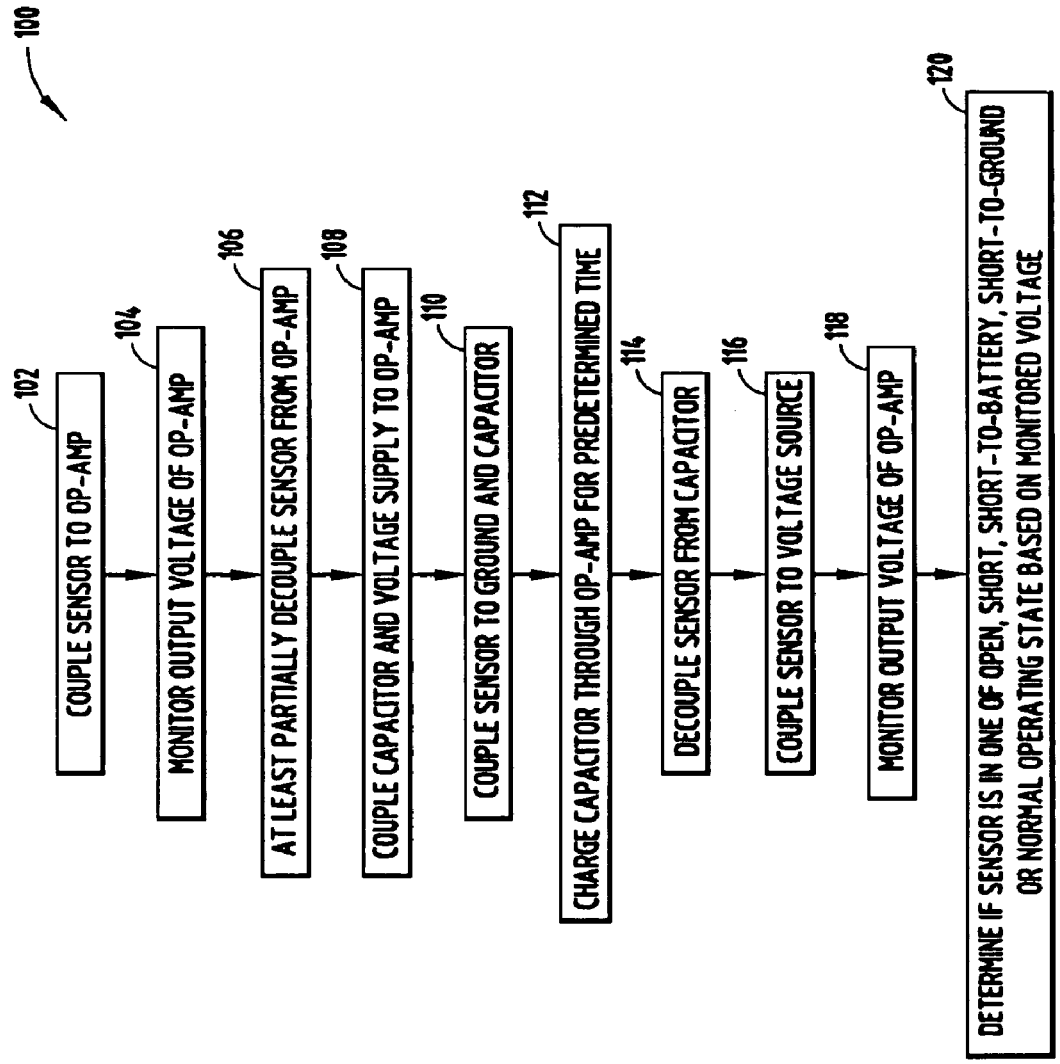

SENSING CIRCUIT AND METHOD FOR DIAGNOSING OPEN AND SHORT CIRCUIT CONDITIONS OF A SENSOR

TECHNICAL FIELD

The present invention is generally directed to diagnostic monitoring of sensors, and, more specifically, to circuitry and methods for monitoring vehicle sensors to identify short circuit and open circuit conditions in the sensors.

BACKGROUND OF THE INVENTION

Engine knock, which can create uncontrolled combustion in vehicle internal combustion engines, is a condition that typically occurs when ignition timing of the vehicle engine is advanced improperly. To avoid engine knock, which can lead to engine damage, engine knock sensors are often used. Engine knock sensors are typically configured to detect which cylinder or cylinders of an internal combustion engine are experiencing a knock condition. When engine knock sensors are coupled to vehicle engine control modules that control the operation of the engine, the vehicle engine control module can monitor the engine knock sensors, and modify the ignition timing of the engine until the knock condition is no longer detected by the engine knock sensors. Engine knock sensors can also be employed to help vehicle engine control modules to know how to adjust the timing of the engine to provide improved fuel economy and torque.

To insure that engine knock sensors are operating properly, it is typically required to monitor the engine knock sensors periodically. More specifically, it can be necessary to diagnose situations in which the engine knock sensors are in an open circuit condition, short circuit condition, shorted to the battery voltage of the vehicle, and/or shorted to ground. In order to diagnose and remedy these sensor fault conditions, the engine knock sensors are typically monitored while the engine is running.

In one conventional method used to detect open and short circuit conditions in engine knock sensors, the values of the output signal of the engine knock sensor are accumulated over a relatively long period of time, and analyzed by a processor. The processor uses algorithms to determine the noise floor of the sensor based on the gathered engine knock sensor output values. The processor further processes this information to determine if the sensor is in an open circuit, short circuit, or normal condition.

In another conventional method, a dedicated analog-to-digital port and external circuit are used to sense the input common mode voltage of the sensor and compare it to some pre-defined threshold. If the common mode voltage shifts relative to the pre-defined threshold, a short circuit condition in the sensor may be indicated. However, this method is typically unable to distinguish between a short to battery and a short to ground condition. In addition, this method is typically unable to distinguish between a short across the sensor and an open sensor condition.

In still another conventional method, an AC test signal is injected into the sensor, rectified, and compared to a threshold value to determine whether the sensor is in an open circuit condition, short circuit condition, or normal operating condition. While typically providing better results than the first two methods discussed above, an accurate AC test signal typically needs to be generated on the chip. This can be difficult to implement in some integrated circuit design processes, and thus, complicates the circuit design and cost. In addition, this method generally does not provide for a distinction between short circuit to battery conditions and short circuit to ground conditions.

In yet another conventional method, comparators are integrated into the sensor interface circuitry to measure the voltage at the positive and negative terminals of the sensor to discriminate between short to battery conditions and short to ground conditions. However, this method is typically unable to differentiate between short circuit conditions across the sensor, open circuit conditions, and conditions in which the sensor is operating normally. In addition, this method generally is less desirable due to the fact that two comparators are typically required at each of the positive and negative terminals of the sensor, adding to overall system cost.

What is needed is a cost-effective method and sensing circuitry for identifying open circuit, short circuit, and normal operating conditions in engine knock sensors.

SUMMARY OF THE INVENTION

In accordance with one aspect of the present invention, a sensing circuit for detecting open and short circuit conditions in a sensor is provided. The sensing circuit includes switching circuitry that is electrically coupled to a sensor, and also includes a voltage supply, test capacitor, and operational amplifier electrically coupled to the switching circuitry. The sensing circuit is configured to provide for a normal operating mode in which the switching circuitry electrically couples the sensor to the voltage supply and the operational amplifier, such that the output of the operational amplifier is indicative of the voltage across the sensor. The sensing circuit is also configured to provide for a charging mode in which the switching circuitry electrically couples the voltage supply to the operational amplifier, and the test capacitor to the operational amplifier and sensor, such that the output voltage of the operational amplifier is a function of the voltage supply voltage and a ratio of the test capacitor capacitance to the sensor capacitance.

In accordance with another aspect of the present invention, a method for detecting open and short circuit conditions in a sensor is provided. The method includes the steps of coupling first and second sensor conductors to first and second inputs, respectively, of an operational amplifier, and monitoring the output voltage of the operational amplifier to provide a first monitored voltage. The method further includes the steps of decoupling the first conductor of the sensor from the first input of the operational amplifier, coupling the first electrode of a capacitor to the second conductor of the sensor and the second input of the operational amplifier, and coupling a second electrode of the capacitor to the output of the operational amplifier. The method further includes the steps of charging the capacitor through the operational amplifier, decoupling the second conductor of the sensor from the capacitor, and monitoring the output voltage of the operational amplifier to provide a second monitored voltage.

In accordance with yet another aspect of the present invention, a vehicle sensing circuit for detecting open and short conditions in a vehicle sensor is provided. The system includes a vehicle sensor having a capacitance, and switching circuitry electrically coupled to the vehicle sensor. The system also includes a voltage supply, a test capacitor, and an operational amplifier that are electrically coupled to the switching circuitry. The test capacitor has a test capacitance. The vehicle sensing circuitry is configured to provide for a normal operating mode in which the switching circuitry couples the vehicle sensor to the voltage supply and operational amplifier, such that the output of the operational amplifier is indicative of the voltage across the vehicle sensor. The vehicle sensing circuitry is also configured to provide for a charging mode in which the switching circuitry couples the voltage supply to the operational amplifier, and the test capacitor to the operational amplifier and vehicle sensor, such that the output voltage of the operational amplifier is a function of the supply voltage and a ratio of the test capacitor capacitance and the sensor capacitance.

These and other features, advantages, and objects of the present invention will be further understood and appreciated by those skilled in the art by reference to the following specification, claims, and appended drawings.

BRIEF DESCRIPTION OF THE DRAWINGS

The present invention will now be described, by way of example, with reference to the accompanying drawings, in which:

FIG. 6 is a timing diagram generally illustrating various modes of the sensing circuit of FIG. 2;

FIG. 7 is a table generally illustrating conditions associated with various voltages of the sensing circuit of FIG. 2; and FIG. 8 is a flow diagram generally illustrating a method for detecting open and short circuit conditions in a sensor, according to one embodiment of the present invention.

DESCRIPTION OF THE PREFERRED EMBODIMENTS

Figure 1:
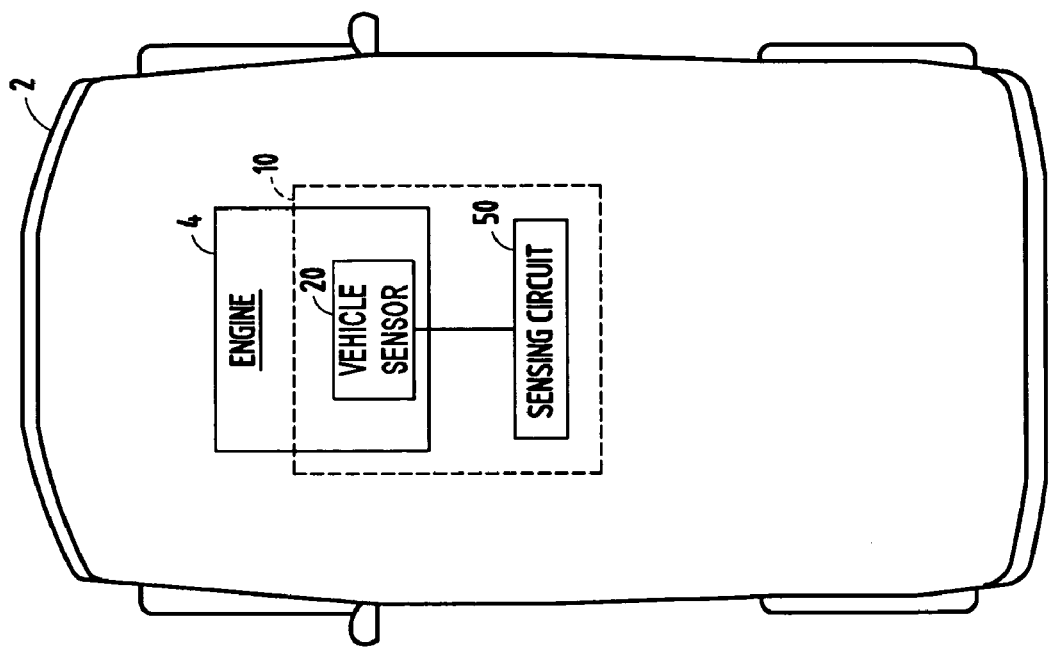
FIG. 1 is a schematic diagram generally illustrating a vehicle including an engine knock sensor and sensing circuitry, according to one embodiment of the present invention.

Referring to FIG. 1, an exemplary automotive vehicle 2 is generally illustrated employing sensor evaluation circuitry 10, according to one embodiment of the present invention. As shown, vehicle 2 includes an internal combustion engine 4, and sensor evaluation circuitry 10. Sensor evaluation circuitry 10 includes a vehicle sensor 20 and sensing circuit 50. In the exemplary embodiment shown, vehicle sensor 20 is a piezoelectric engine knock sensor for sensing an engine knock condition. In an alternate embodiments, vehicle 2 may include wheel speed sensors, transmission speed sensors, or accelerometers (not shown) electrically coupled to sensing circuit 50. In the present embodiment, sensing circuit 50 is configured to monitor voltages and/or currents associated with engine knock sensor 20, and determine, based on the monitored values, if engine knock sensor 20 is operating properly.

Figures 2, 3:
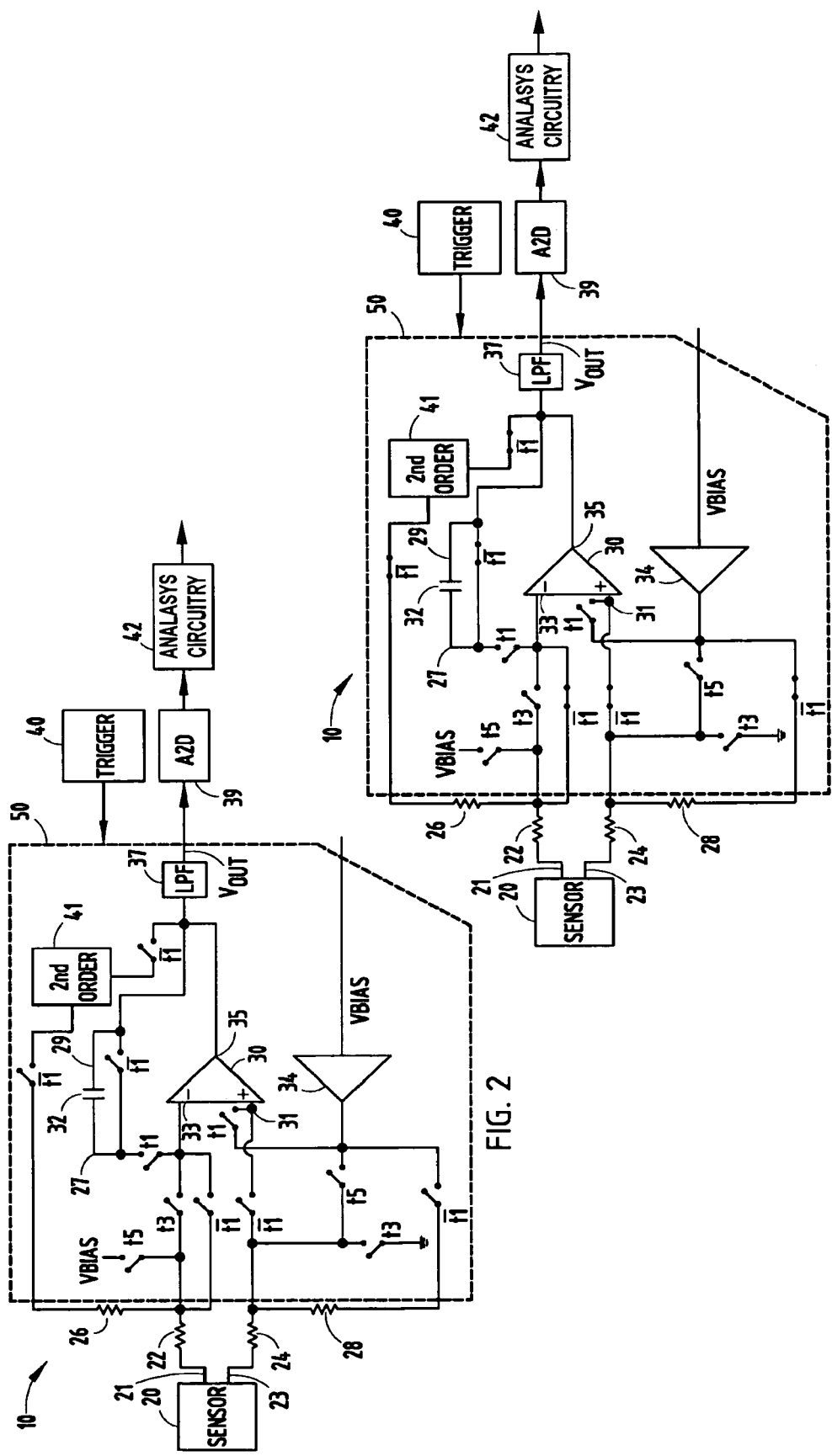
FIG. 2 is a block/circuit diagram generally illustrating a sensing circuit for detecting open and short circuit sensor conditions, according to one embodiment of the present invention.
FIG. 3 is a block/circuit diagram generally illustrating the embodiment of FIG. 2 in which the sensing circuit is in a first mode.

Referring to FIG. 2, additional detail for sensor evaluation circuitry 10 is provided. Sensor evaluation circuitry 10 includes a sensing circuit 50 that is electrically coupled to a vehicle sensor 20 through resistors 22, 24, 26 and 28. Sensor evaluation circuitry 10 also includes trigger circuitry 40 electrically coupled to sensing circuit 50, analog-to-digital converter circuitry 39 electrically coupled to sensing circuit 50, and analysis circuitry 42 electrically coupled to the output of analog-to-digital converter circuitry 39. As shown, sensing circuit 50 receives a voltages VBIAS from external voltage supplies. Sensing circuit 50 includes switching circuitry made up of multiple switches $\overline{t1}$ and t1-t5. Switches $\overline{t1}$ and t1-t5 are configured, such that when a trigger signal is received by sensing circuit 50 from trigger circuitry 40, switches $\overline{t1}$ and t1-t5 sequentially open and close in a predetermined manner to couple various elements of sensor evaluation circuitry 10 together, as discussed in greater detail below.

In the present embodiment, switches $\overline{t1}$ and t1-t5 are transistors. In an alternate embodiment, switches $\overline{t1}$ and t1-t5 are implemented in a different manner, such as, for example, using relays, analog circuitry, or a combination of analog circuitry and logic. Sensing circuit 50 is also shown including an operational amplifier 30 having a first input 33, a second input 31, and an output 35. Sensing circuit 50 also includes a low-pass filter, the output of which is coupled to analog-to-digital converter 39, a buffer 34 coupled to an input bias voltage VBIAS, and a $2^{nd}$ order filter 41. Sensing circuit 50 includes a low-pass filter 37 electrically coupled to the output 35 of an operational amplifier 30. Low-pass filter 37 is electrically coupled to analog-to-digital converter circuitry 39, and is configured to provide a filtered signal provided by output 35 of operational amplifier 30 to analog-to-digital converter circuitry 39. Sensing circuit 50 also includes a buffer 34 electrically coupled to an input bias voltage VBIAS, and a $2^{nd}$ order filter 41 electrically coupled to switches $\overline{t1}$.

Figures 4, 5:
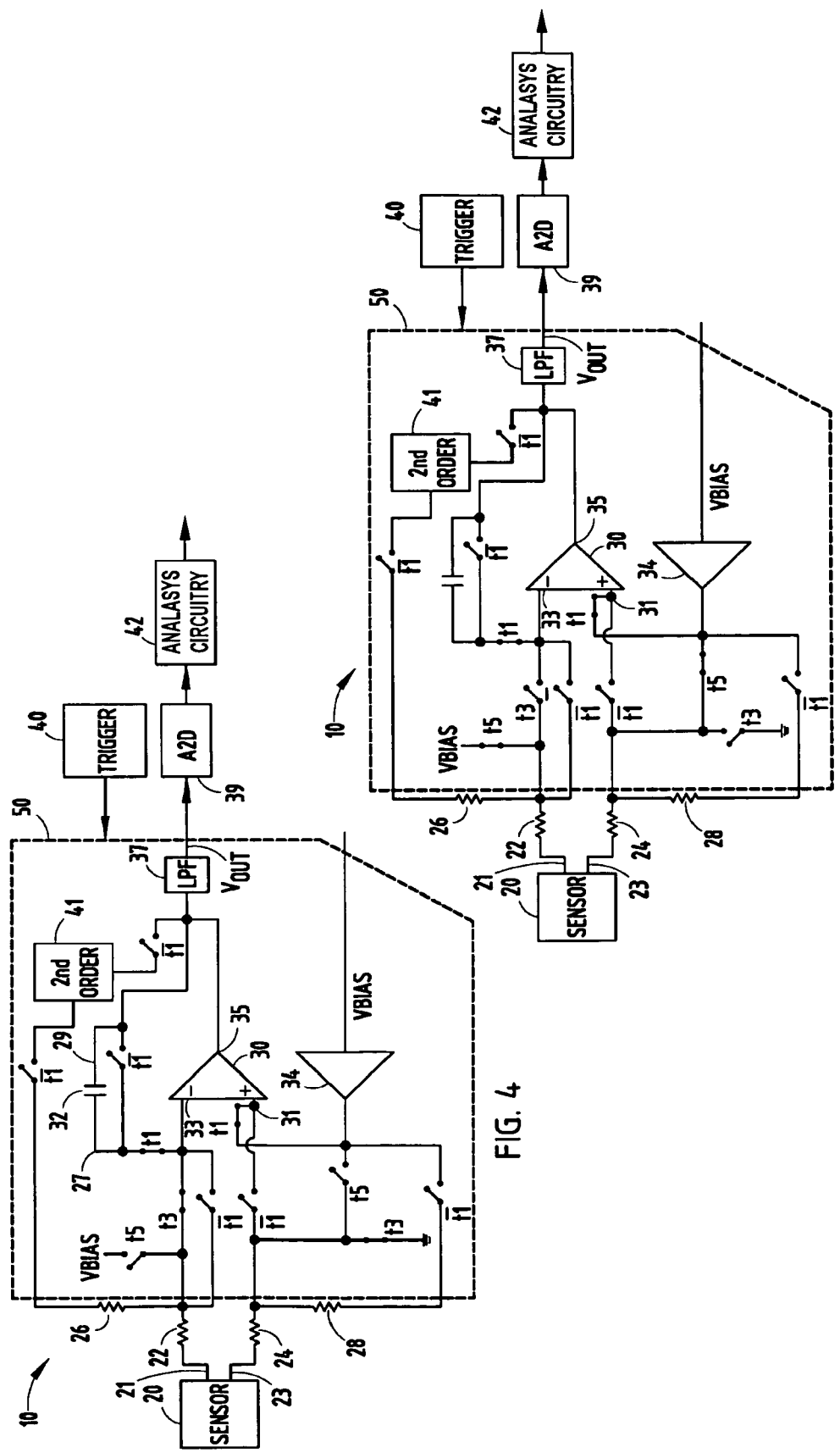
FIG. 4 is a block/circuit diagram generally illustrating the embodiment of FIG. 2 in which the sensing circuit is in a second mode.
FIG. 5 is a block/circuit diagram generally illustrating the embodiment of FIG. 2 in which the sensing circuit is in a third mode.

FIGS. 3-5 will now be referenced to describe the operation of sensor evaluation circuitry 10, as switches $\overline{t1}$ and t1-t5 open and close to cause sensor evaluation circuitry 10 to operate in various modes.

FIG. 3 generally illustrates sensor evaluation circuitry 10 in a first mode of operation, referred to as a normal mode. As shown, in the normal mode, all the switches marked $\overline{t1}$ are closed, while all of the remaining switches t1-t5 remain open. Sensor evaluation circuitry 10 operates in the normal mode when a trigger signal is not provided to sensing circuit 50 by trigger circuitry 40. As can be seen in FIG. 3, closing the switches $\overline{t1}$ has the effect of electrically coupling first conductor 21 of vehicle sensor 20 to a first input 33 of the operational amplifier 30 through resistor 22. As can also be seen in FIG. 3, the first input 33 of the operational amplifier 30 is an inverting input to the operational amplifier 30. Closing the switches $\overline{t1}$ also has the effect of electrically coupling the second conductor 23 of vehicle sensor 20 to a second input 31 of the operational amplifier 30 through a resistor 24. As shown, second input 31 of the operational amplifier 30 is a non-inverting input. In addition, closing switches $\overline{t1}$ has the effect of electrically coupling both ends of the test capacitor 32 to each other, causing test capacitor 32 to discharge. Closing the switches $\overline{t1}$ also has the effect of electrically coupling the output 35 of operational amplifier 30 and the input of low-pass filter 37 to the first input 33 of operational amplifier 30 through second order filter 41 and through a resistor 26. As noted above, the output of low-pass filter 37 is provided as an input to analog-to-digital converter circuitry 39. Analog-to-digital converter circuitry 39 provides the resulting digital signal to analysis circuitry 42. The overall effect of closing the switches $\overline{t1}$ in the normal mode of sensor evaluation circuitry 10 is to cause sensor evaluation circuitry 10 to operate in a differential sense mode. In this mode, the output signal 35 of the operational amplifier 30 is indicative of the voltage across the vehicle sensor 20. Analysis circuitry 42 uses the filtered and digitized output 35 of operational amplifier 30 to determine if the engine 4 of the vehicle 2 generally illustrated in FIG. 1 is in a knock condition.

FIG. 4 generally illustrates sensor evaluation circuitry 10 after sensor evaluation circuitry 10 has entered a second mode of operation, referred to herein as the charge mode. The charge mode is entered when sensing circuit 50 receives a trigger signal from trigger circuitry 40. When the trigger signal is received from trigger circuitry 40, switches t1 of sensing circuit 50 close, while switches t̄1̄ of sensing circuit 50 open. This has the effect of coupling the bias voltage VBIAS through buffer 34 to the second input 31 of the operational amplifier 30, while also coupling the output 35 of operational amplifier 30 to the first input 33 of the operational amplifier 30 through test capacitor 32. As noted above, the output 35 of operational amplifier 30 is also coupled to the input of low-pass filter 37, which provides its output signal to analysis circuitry 42 via analog-to-digital converter 39.

As also shown in FIG. 4, switches t3 are also closed in the charge mode. Closing the switches t3 has the effect of electrically coupling a first conductor 21 of the vehicle sensor 20 to the first input 33 of operational amplifier 30 through resistor 22. Closing the switches t3 also couples the second conductor 23 of the vehicle sensor 20 to ground through resistor 24. This results in a charge having a magnitude of voltage VBIAS being applied to test capacitor 32 and to the vehicle sensor 20. It should be appreciated that the vehicle sensor 20 has a capacitance, and that the application of a charge to both the test capacitor 32 and vehicle sensor 20 results in test capacitor 32 and vehicle sensor 20 charging until they reach the value of their respective capacitances. The amount of time required to charge test capacitor 32 and sensor 20 will vary depending on the time constant of the RC load including test capacitor 32 and vehicle sensor 20.

During this charging mode, operational amplifier 30 operates as a single-ended operational amplifier with the non-inverting second input 31 of the operational amplifier 30 connected to VBIAS. In the present embodiment, voltage VBIAS has a value that is approximately one half of the power supply voltage supplied to operational amplifier 30. Because the power supply voltage of the present embodiment is 5V, VBIAS has a value of approximately 2.5V. During this charging mode, the output voltage of the output 35 of operational amplifier 30 will charge up such that the output voltage VOUT provided by output 35 of operational amplifier 30 reaches a value according to the following exemplary equation:

$$VOUT = \left[VBIAS\left(\frac{C_{sensor}}{C_{test}} + 1\right)\right]\left(\frac{1}{2RsC_{sensor} + 1}\right)$$

It should be appreciated that the first component in this expression is independent of the input frequency, and acts to attenuate voltage VBIAS by a capacitive divider ratio $$\left(\frac{C_{sensorr}}{C_{test}} + 1\right).$$

In the present embodiment, the capacitor divider ratio is utilized by analysis circuitry 42, along with the value of the bias voltage VBIAS, to determine if the vehicle sensor 20 is operating in a short circuit condition, open circuit condition, or proper operating condition. The second component of the expression is dependent on the frequency of the input signal, and is ignored for purposes of DC analysis. It effectively acts as a low-pass filter to filter out sensor noise from vehicle sensor 20 during the diagnostic phase of sensor evaluation circuitry 10. The diagnostic phase of sensor evaluation circuitry 10 is the phase during which the switches t1 are closed and the switches t̄1̄ are open. It should be appreciated, with reference to the expression above, that the bias voltage VBIAS and test capacitance of test capacitor 32, $C_{test}$, are known. In addition, the output voltage VOUT provided by the output 35 of operational amplifier 30 is known, leaving only the sensor capacitance $C_{sensor}$ as an unknown. In the present embodiment, the values of resistors 22 and 24 are equal, and are represented in the above exemplary equation by the term 2R.

By determining the value of the sensor capacitance $C_{sensor}$ and evaluating the output voltage VOUT once test capacitor 32 and vehicle sensor 20 have reached their fully charged capacitance values, analysis circuitry 42 can determine various states of the vehicle sensor 20. For example, in a situation in which the vehicle sensor 20 is in an open circuit condition, sensor capacitance $C_{sensor}$ will have a small value, effectively causing the output voltage VOUT provided by the output 35 of operational amplifier 30 to be close to voltage VBIAS. Alternatively, if vehicle sensor 20 is in a short circuit condition, the capacitance of vehicle sensor 20, $C_{sensor}$, will be higher, resulting in an output voltage VOUT at the output 35 of operational amplifier 30 that is approximately equal to the rail voltage of the operational amplifier 30. It should also be appreciated that in situations in which sensor capacitance $C_{sensor}$ is determined to be less than 200 pico-Farads, an open circuit condition is indicated for the vehicle sensor 20. If sensor capacitance $C_{sensor}$ is determined to be greater than 3 nano-Farads, this is indicative of vehicle sensor 20 operating in a short circuit condition. If sensor capacitance $C_{sensor}$ is determined to be between approximately 1.8 nano-Farads and 800 pico-Farads, this is indicative of vehicle sensor 20 that is operating properly.

FIG. 5 generally illustrates a third mode of sensor evaluation circuitry 10, called the read mode, that follows the charging mode generally illustrated in FIG. 4. In this mode, the switches t1 remain closed, switches t5 are closed, and switches t3 are open. Because the switches t1 remain closed and the switches t3 are open, the output voltage VOUT of the output 35 of operational amplifier 30 is maintained at the level that it reached during the charging mode generally illustrated in FIG. 4. In addition, because switches t5 are closed, the internal capacitance of the sensor 20 is returned to the level of VBIAS. This is because closing the switches t5 electrically couples the first conductor 21 of vehicle sensor 20 to voltage VBIAS through resistor 22, and the second conductor 23 of vehicle sensor 20 to voltage VBIAS provided via buffer 34 through resistor 24. The effect of closing switches t5 in this mode is to remove the charge that was placed on the sensor 20 during the charging phase generally illustrated in FIG. 4. At any time during the read mode, analysis circuitry 42 may evaluate the output voltage VOUT provided at the output 35 of operational amplifier 30 to determine the operational state of the vehicle sensor 20 as discussed above with respect to FIG. 4.

At some point after analysis circuitry 42 has obtained an output voltage VOUT from operational amplifier 30 indicative of the operation of vehicle sensor 20 in the read mode, trigger circuitry 40 removes the trigger signal provided to sensing circuit 50. When the trigger signal is removed, sensor evaluation circuitry 10 returns to the normal operating mode generally illustrated in FIG. 3, in which switches t̄1̄ are closed and all other switches are open. Sensor evaluation circuitry 10 remains in the normal operating mode until trigger circuitry 40 issues another trigger signal to sensing circuit 50.

The sensor evaluation circuitry 10, as described above, provides for the ability to discriminate among various types of DC faults in a vehicle sensor 20 coupled to sensing circuit 50. These faults include open circuit, first conductor 21 short to ground or battery, second conductor 23 short to ground or battery, and a short across the sensor 20.

FIG. 6 generally illustrates timing associated with the modes provided by sensor evaluation circuitry 10, as described above. During the periods $\overline{t1}$ illustrated in FIG. 6, the $\overline{t1}$ switches of sensor evaluation circuitry 10 are closed, while the other switches t1-t5 are open. During the period $\overline{t1}$ illustrated in FIG. 6, sensor evaluation circuitry 10 is operating in the normal operating mode in which operational amplifier 30 provides as an output 35 the voltage difference between first conductor 21 and second conductor 23 of vehicle sensor 20. In the present embodiment, the value of the voltage difference in the normal operating mode is indicative of whether the vehicle engine is in a knock condition.

During the period t1 illustrated in FIG. 6, the switches $\overline{t1}$ are open, switches t1 are closed, and sensor evaluation circuitry 10 is operating in a diagnostic mode in which the functionality of the vehicle sensor 20 is evaluated by analysis circuitry 42. This diagnostic mode includes a charge mode in which switches t1 and t3 are closed. This is generally illustrated in FIG. 6 as a period t3. During this period, test capacitor 32 and vehicle sensor 20 are charged until they reach the capacitance levels $C_{test}$ and $C_{sensor}$, respectively. The diagnostic mode also includes a read mode in which switches t1 remain closed, switches t5 are closed, and switches t3 are open. This is generally illustrated in FIG. 6 as a period t5. During this read mode, the output voltage VOUT provided by output 35 of operational amplifier 30 is maintained at an output level indicative of the condition of vehicle sensor 20. At any time during this period, analysis circuitry 42 may read the output voltage VOUT provided by output 35 of operational amplifier 30 to determine the operating condition of vehicle sensor 20. In addition, in the read mode illustrated as period t5 of FIG. 6, bias voltage VBIAS is applied to both inputs of vehicle sensor 20, such that vehicle sensor 20 reaches the voltage VBIAS voltage during this phase.

As also shown in FIG. 6, once a trigger signal from trigger circuitry 40 is removed, sensor evaluation circuitry 10 returns the normal operating mode in which only switches $\overline{t1}$ are closed. FIG. 6 also generally illustrates the output voltage VOUT provided by the output 35 of operational amplifier 30 during each of the modes of operation of sensor evaluation circuitry 10.

FIG. 6 also illustrates delay periods, shown as periods t2, t4, and t6. These periods are non-overlapping delay periods between the normal, charging, and read modes, and provide time for the various switches to switch into the various modes.

The table illustrated in FIG. 7 shows the output voltage VOUT provided by output 35 of operational amplifier 30 during the normal operating mode and the diagnostic mode used to determine the condition of the vehicle sensor 20. As seen, if the output voltage VOUT is less than 2 Volts during the normal operating mode, the vehicle sensor 20 is in a short circuit condition. Whether the vehicle sensor 20 is shorted to battery or shorted to ground, and which conductor of vehicle sensor 20 is shorted, can be determined by the value of the output voltage VOUT during the diagnostic mode. If the output voltage VOUT during the diagnostic mode is 0 Volts, this is indicative of the first conductor 21 of vehicle sensor 20 being shorted to battery. If, however, the output voltage VOUT during diagnostic mode is approximately VBIAS (2.5 Volts in the present embodiment) or higher, this is indicative of the second conductor 23 of vehicle sensor 20 being shorted to ground.

If the output voltage VOUT during the normal operating mode is approximately 2.5 Volts, this is indicative of an open circuit condition, a short across the vehicle sensor 20, or a normal operation of the vehicle sensor 20. Whether the vehicle sensor 20 is in an error condition or is operating normally can be determined by monitoring the value of the output voltage VOUT during the diagnostic mode. If the output voltage VOUT during the diagnostic mode is between 2.8 and 3.8 Volts, vehicle sensor 20 is operating normally. If, however, the output voltage VOUT during the diagnostic mode is approximately 2.5 Volts, this is indicative of an open circuit condition in vehicle sensor 20. If the output voltage VOUT during the diagnostic mode is approximately equal to the rail voltage, this is indicative of a short across the vehicle sensor 20.

If the output voltage VOUT during the normal operating mode is greater than 3.0 Volts, this is indicative of either first conductor 21 of vehicle sensor 20 being shorted to ground, or second conductor 23 of vehicle sensor 20 being shorted to battery. If the output voltage VOUT in the diagnostic mode is less than 2.5 Volts, this is indicative of the second conductor 23 of vehicle sensor 20 being shorted to battery. If the output voltage VOUT during diagnostic mode is equal to the rail voltage of operational amplifier 30, this is indicative of a first conductor 21 of vehicle sensor 20 being shorted to ground.

By employing sensor evaluation circuitry 10 to determine output voltages VOUT during both the normal operating mode and the diagnostic mode, sensor evaluation circuitry 10 can determine if a vehicle sensor 20 is operating properly, or is in a short circuit or open circuit condition. In addition, sensor evaluation circuitry 10 can use the output voltage VOUT during the normal and diagnostic modes to determine, in a short circuit condition, which of the conductors 21 and 23 of vehicle sensor 20 are shorted to battery and/or shorted to ground, and whether there is a short across the vehicle sensor 20.

FIG. 8 generally illustrates a method 100 for detecting open and short circuit conditions in a sensor. In a first step 102 of the method 100, a sensor is coupled to an operational amplifier. In a second step 104 of the method, the output voltage of the operational amplifier is monitored while the operational amplifier is coupled to the sensor. In a third step 106 of the method 100, the sensor is at least partially decoupled from the operational amplifier such that at least one input of the operational amplifier is not coupled to the sensor. In a fourth step 108 of the method 100, a capacitor is coupled to one input of the operational amplifier, while a voltage supply is coupled to another input of the operational amplifier. In a fifth step 110 of the method 100, one conductor of a sensor is coupled to ground, while the other conductor of the sensor is coupled to the portion of the capacitor that is not coupled to the operational amplifier. In a sixth step 112 of the method 100, the capacitor is charged through the operational amplifier for a predetermined period of time. In a seventh step 114 of the method 100, the sensor is decoupled from the capacitor. In an eighth step 116 of the method 100, the sensor is coupled to a voltage source. In a ninth step 118 of the method 100, the output voltage of the operational amplifier is monitored, while the operational amplifier is coupled to the capacitor. In a tenth step 120 of the method 100, the output voltage of the operational amplifier is used to determine if the sensor is in one of an open circuit, short circuit to battery, short circuit to ground, short across the sensor, or normal operating state.

Although the embodiments of the present invention generally described above employ a sensing circuit 50 coupled to an engine knock sensor 20, it should be appreciated that sensing circuit 50, in other embodiments, may be differentially coupled to other sensors, including vehicle sensors, or sensors employed in applications other than vehicle applications, to determine if the sensor to which sensing circuit 50 is coupled is operating properly. In addition, although the switches t̄1 and t1-t5 in the above-described embodiments are transistors, it should be appreciated that in alternate embodiments, t̄1 and t1-t5 could be implemented by electronic circuitry other than transistors, such as, for example, relays, analog circuitry, or analog circuitry in combination with logic. In addition, although in the present embodiments, switches t̄1 and t1-t5 are disclosed as being separate switches, it should be appreciated that in alternate embodiments, the switches t̄1 and/or t1-t5 could be combined in other switching circuitry, provided that the switching circuitry acts to couple the operational amplifier 30, voltage supplies, and other elements of sensor evaluation circuitry 10, as described above, to support the modes generally described above.

The present invention advantageously provides for circuitry and a method for cost effectively monitoring sensors using an operational amplifier, in combination with switches, to determine, based on the output voltage of the operational amplifier, if the monitored sensor is in an open circuit condition, short circuit condition, or normal operating condition. The invention further advantageously provides the ability to determine, if a short-circuit condition exists, the nature of the short-circuit condition, including which of the terminals of the sensor are shorted, and to what they are shorted (battery, ground, or each other).

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A sensing circuit for detecting open and short circuit conditions in a sensor, comprising:
   switching circuitry electrically coupled to a sensor having a sensor capacitance;
   a voltage supply electrically coupled to said switching circuitry;
   a test capacitor coupled to said switching circuitry and having a test capacitance;
   an operational amplifier having inputs and at least one output said operational amplifier being electrically coupled to said switching circuitry, wherein said sensing circuit is configured to provide for a normal operating mode in which said switching circuitry electrically couples the sensor to said voltage supply and said operational amplifier such that the output of said operational amplifier is indicative of the voltage across the sensor, and wherein said sensing circuit is further configured to provide for a charging mode in which said switching circuitry electrically couples said voltage supply to said operational amplifier, and electrically couples said test capacitor to said operational amplifier and the sensor, such that the output voltage of said operational amplifier is a function of the voltage provided by said voltage supply and a ratio of the test capacitor capacitance to the sensor capacitance; and
   analysis circuitry coupled to the output of said operational amplifier, wherein said analysis circuitry is configured to monitor the output voltage by said operational amplifier and determine, based on the monitored voltage, if the sensor is in one of an open-circuit condition, a short-circuit condition, a shorted to battery condition, a shorted to ground condition, and a normal operating condition.

2. The sensing circuit of claim 1, wherein said sensing circuit is further configured to remain in the charging mode for a predetermined charging period tat is at least equal to the amount of time required to allow the test capacitor capacitance and the sensor capacitance to reach steady state values.

3. The sensing circuit of claim 2, wherein said sensing circuit is still further configured to provide for a read mode following the charging mode in which said switching circuitry electrically decouples the sensor from said test capacitor such tat the test capacitor maintains the output of said operational amplifier at the level being output by said operational amplifier at the end of the predetermined charging period at the charging mode.

4. The sensing circuit of claim 3, wherein said sensing circuit is further configured to return to the normal operating mode following the read mode.

5. The sensing circuit of claim 4, further comprising trigger circuitry electrically coupled to said sensing circuit said trigger circuitry configured to issue a trigger signal to said sensing circuit, wherein said sensing circuit is configured to operate in the normal operating mode until a trigger signal is received, and wherein said sensing circuit is further configured to enter a charging mode followed by a read mode following a trigger signal from said trigger circuitry.

6. The sensing circuit of claim 5, wherein said sensing circuit is configured to switch from the read mode to the normal mode only when a trigger signal is not present.

7. The sensing circuit of claim 1, further comprising at least one low-pass filter coupled to the output of said operational amplifier.

8. The sensing circuit of claim 1, further comprising analog-to-digital converter circuitry coupled to the output of said operational amplifier.

9. The sensing circuit of claim 1, wherein the sensor is a vehicle sensor configured to sense an operating condition of a vehicle.

10. The sensing circuit of claim 9, wherein the vehicle sensor is one of an engine knock sensor, a wheel speed sensor, a transmission speed sensor, and an accelerometer.

11. The sensing circuit of claim 1, wherein the sensor is a piezoelectric sensor.

12. The sensing circuit of claim 1, wherein said analysis circuitry is configured to monitor the output of said operational amplifier in each of the normal mode and read mode, and is also configured to determine, based on the value of the monitored voltage, if the sensor is in each of an open-circuit condition, a short-circuit condition a shorted to battery condition, and a shorted to ground condition.

13. A vehicle sensing circuit for detecting open and short conditions in a vehicle sensor, comprising:
   a vehicle sensor configured to sense an operating condition of a vehicle, said vehicle sensor having a sensor capacitance;
   switching circuitry electrically coupled to said vehicle sensor;
   a voltage supply electrically coupled to said switching circuitry;
   a test capacitor coupled to said switching circuitry, said test capacitor having a test capacitance;

an operational amplifier having inputs and at least one output said operational amplifier being electrically coupled to said switching circuitry, wherein said vehicle sensing circuit is configured to provide for a normal operating mode in which said switching circuitry electrically couples said vehicle sensor to said voltage supply and said operational amplifier such tat the output of said operational amplifier is indicative of a voltage across said vehicle sensor, and wherein said vehicle sensing circuit is further configured to provide for a charging mode in which said switching circuitry electrically couples said voltage supply to said operational amplifier, and electrically couples said test capacitor to said operational amplifier and said vehicle sensor, such that the output voltage of said operational amplifier is a function of the voltage provided by said voltage supply and a ratio of the test capacitor capacitance to the sensor capacitance, wherein the magnitude of the voltage provided by said voltage supply is a bias voltage approximately equal to one half of a power supply voltage provided to said operational amplifier.

14. The vehicle sensing circuit of claim 13, wherein said vehicle sensing circuit is further configured to remain in the charging mode for a predetermined charging period tat is at least equal to the amount of time required to allow the test capacitor capacitance and sensor capacitance reach steady state values.

15. The vehicle sensing circuit of claim 14, wherein said vehicle sensing circuit is further configured to provide for a read mode following the charging mode in which said switching circuitry electrically decouples said vehicle sensor from said test capacitor such that said test capacitor maintains the output of said operational amplifier at the level being output by said operational amplifier at the end of the predetermined charging period of the charging mode.

16. The vehicle sensing circuit of claim 13, wherein the magnitude of the bias voltage provided by said voltage supply is approximately 2.5 volts.

* * * * *